United States Patent
Ohlberg

(12) 
(10) Patent No.: US 7,309,875 B2
(45) Date of Patent: Dec. 18, 2007

(54) NANOCRYSTAL PROTECTIVE LAYER FOR CROSSBAR MOLECULAR ELECTRONIC DEVICES

(75) Inventor: Douglas A. Ohlberg, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 79 days.

(21) Appl. No.: 10/995,809

(22) Filed: Nov. 22, 2004

(65) Prior Publication Data

US 2006/0108577 A1    May 25, 2006

(51) Int. Cl.
*G11C 11/00* (2006.01)
*H01L 51/10* (2006.01)
(52) U.S. Cl. ............... 257/40; 365/153; 257/E51.011; 977/830; 977/943; 438/99; 438/901; 438/962
(58) Field of Classification Search ............... 365/153, 365/167, 244; 977/830, 943; 257/E51.023, 257/E51.008, E51.011, 40–41; 438/99–101, 438/901, 962
See application file for complete search history.

(56) References Cited

U.S. PATENT DOCUMENTS

| | | | |
|---|---|---|---|
| 5,677,545 A * | 10/1997 | Shi et al. .................... 257/40 |
| 5,858,666 A * | 1/1999 | Weiss ............................ 435/6 |
| 6,159,620 A * | 12/2000 | Heath et al. ................. 428/615 |
| 6,430,511 B1 * | 8/2002 | Tour et al. ..................... 702/19 |
| 6,451,942 B1 * | 9/2002 | Li et al. ....................... 526/258 |
| 6,541,617 B1 * | 4/2003 | Bamdad et al. ............. 536/23.1 |
| 6,730,395 B2 * | 5/2004 | Covington ............... 428/811.1 |
| 6,760,245 B2 * | 7/2004 | Eaton et al. ................. 365/100 |
| 6,998,637 B2 * | 2/2006 | Luyken et al. ................. 257/40 |
| 7,060,243 B2 * | 6/2006 | Bawendi et al. ............. 423/508 |
| 2002/0127756 A1 * | 9/2002 | Wessels et al. ............... 438/39 |
| 2002/0176276 A1 | 11/2002 | Zhang |
| 2003/0034486 A1 * | 2/2003 | Korgel ......................... 257/13 |
| 2003/0183847 A1 * | 10/2003 | Kornilovich ................. 257/200 |
| 2005/0017759 A1 * | 1/2005 | Weber et al. .................. 327/10 |
| 2005/0116256 A1 * | 6/2005 | Bulovic et al. .............. 257/200 |
| 2005/0266697 A1 * | 12/2005 | Korgel et al. ................ 438/758 |

OTHER PUBLICATIONS

Heath, Knobler, and Leff. J. Phys. Chem. B. 101 (1997): 189-197.*
Gittins, Bethell, Schiffrin, and Nichols. Nature. 408 (2000): 67-69.*
Kovtyukhova, N. I. and Mallouk, T. E. "Nanowires as Building Blocks for Self-Assembled Logic and Memory Circuits." Chem. Eur. J. vol. 8 (2002): pp. 4355-4363.*
James R. Heath, et al., Pressure/TEmperature Phase Diagrams and Superlattices of Organically Functionalized Metal Nanocrystal Monolayers: The Influence of Particle size, Size Distribtuion and Surface Passivant, Journal Physical Chemistry B 1997, 101, pp. 189-197.
T. Vossmeyer, et al., Combinatorial approaches toward patterning nanocrystals, 1998 American Institute of Physics, pp. 3664-3670.

* cited by examiner

*Primary Examiner*—B. William Baumeister
*Assistant Examiner*—Matthew W. Such

(57) ABSTRACT

A molecular device is provided. The molecular device comprises a junction formed by a pair of crossed electrodes where a first electrode is crossed by a second electrode at a non-zero angle and at least one connector species including at least one switchable moiety and connecting the pair of crossed electrode in the junction. The junction has a functional dimension ranging in size from microns to nanometers. The molecular device further includes a buffer layer comprising nanocrystals interposed between the connector species and the second electrode.

30 Claims, 5 Drawing Sheets

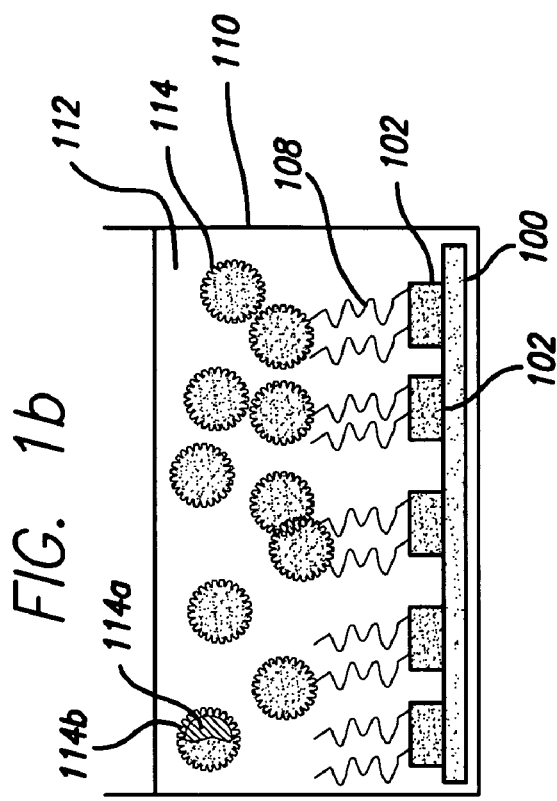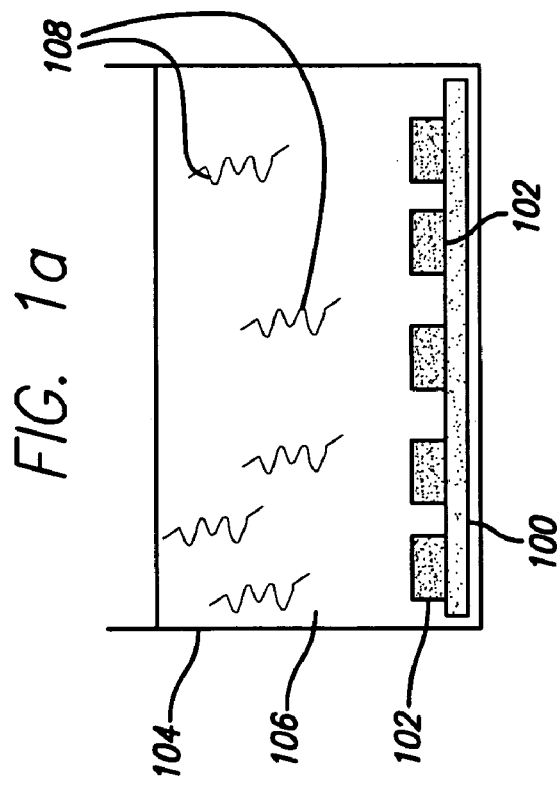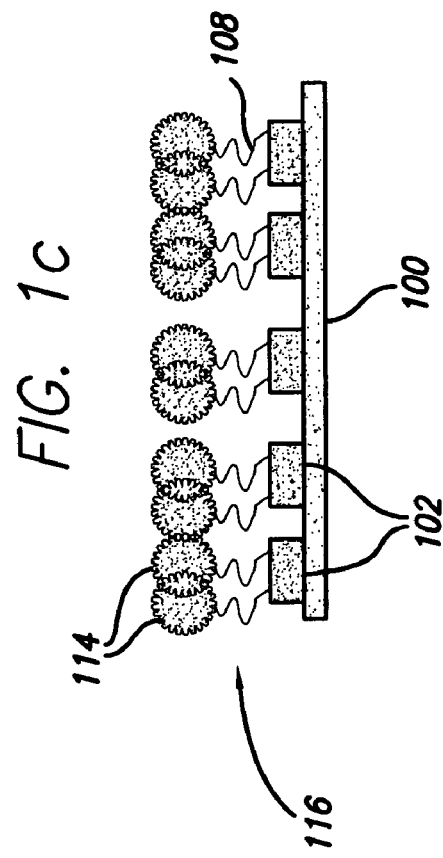

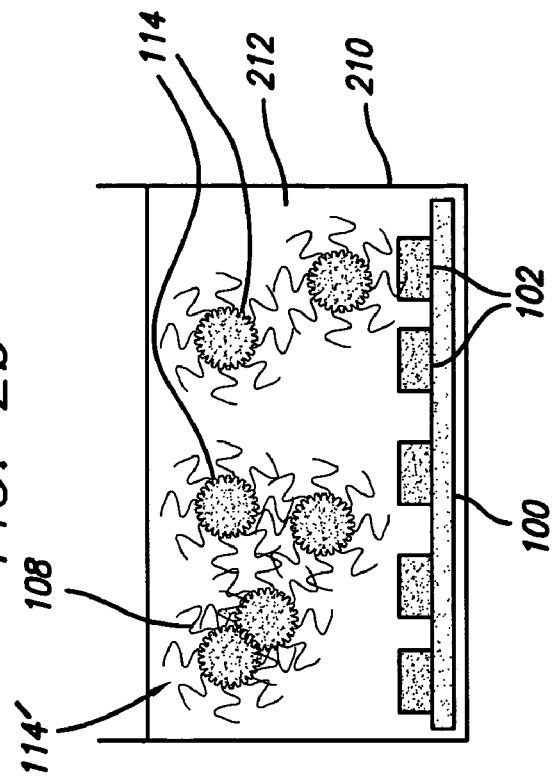
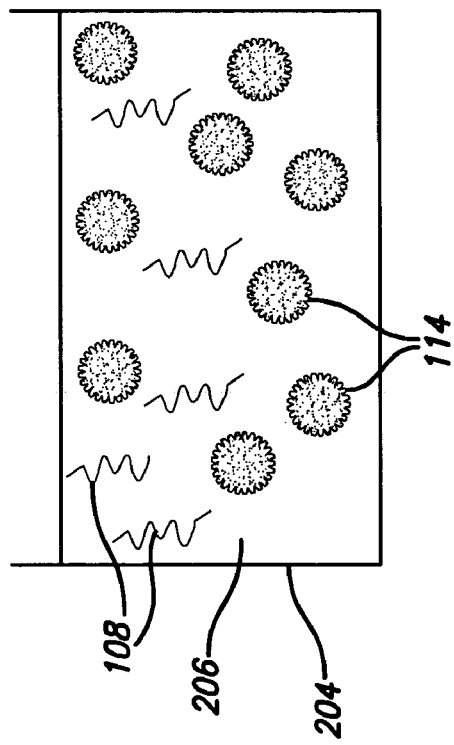
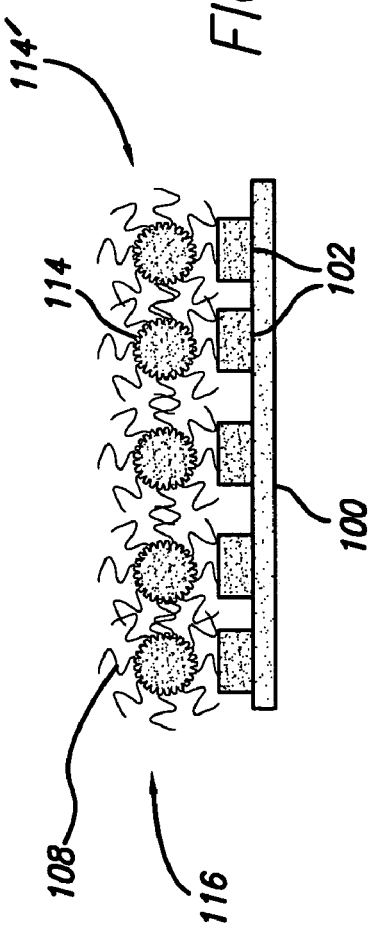

NANOCRYSTAL PROTECTIVE LAYER FOR CROSSBAR MOLECULAR ELECTRONIC DEVICES

TECHNICAL FIELD

The present invention is directed to crossbar molecular electronic devices comprising crossed electrodes having a switchable molecular moiety at the crosspoint and, more particularly, to mechanisms for protecting the molecular moieties during processing.

BACKGROUND ART

Crossbar molecular electronic devices (CMED) typically consist of a top and bottom electrode, between which a layer of organic molecules is sandwiched in a planar configuration on an insulating substrate. The particular chemical and electronic properties of an organic molecule define the functionality of the CMED and to date, arrays of such devices have been made demonstrating programmable resistor logic, diode logic, and bistable switching, depending on the choice of the respective molecule.

One challenge with the construction of CMEDs is the fabrication of the top conducting electrode onto the molecular layer. The material for this electrode (usually a metal) is conventionally deposited by thermal or sputter deposition sources positioned with a line-of-sight to the substrate bearing the bottom electrode/molecular layer array. The problem with such sources is that they impart a high kinetic energy to the metal atoms, allowing them to either penetrate the molecular layer and short the device and/or undergo chemical reaction with the organic layer that unpredictably changes its chemical and electronic properties.

One approach to addressing this problem involves chilling the substrate bearing the bottom electrode/molecular layer array in a chamber filled with sub-Torr pressures of an inert gas to moderate the kinetic energies of incoming metal atoms that would originate from sources that do not have a direct line of sight to the substrate. Such an approach, while effective, can be inefficient, time-consuming, and costly, as most of the top electrode source material is wasted.

Thus, there remains a need for a mechanism for protecting the molecular layer during fabrication of the top electrode.

DISCLOSURE OF INVENTION

In accordance with an embodiment disclosed herein, a molecular device is provided. The molecular device comprises a junction formed by a pair of crossed electrodes where a first electrode is crossed by a second electrode at a non-zero angle and at least one connector species comprising at least one switchable molecule and connecting the pair of crossed electrodes in the junction. The functional dimension of the junction can range in size from a few microns to nanometers. The molecular device further includes a buffer layer comprising nanocrystals interposed between the connector species and the second electrode.

In accordance with another embodiment, a crossbar is formed by an array of the molecular devices.

In accordance with yet another embodiment, a method of fabricating the molecular device comprises: forming a buffer layer comprising nanocrystals on the connector species and forming the second electrode on the buffer layer.

BRIEF DESCRIPTION OF THE DRAWINGS

FIGS. 1a-1c are each a schematic view, depicting an embodiment for forming a buffer layer over switchable molecules on patterned electrodes on a substrate;

FIGS. 2a-2c are each a schematic view, depicting another embodiment for forming the buffer layer;

BEST MODES FOR CARRYING OUT THE INVENTION

Figure 3A:
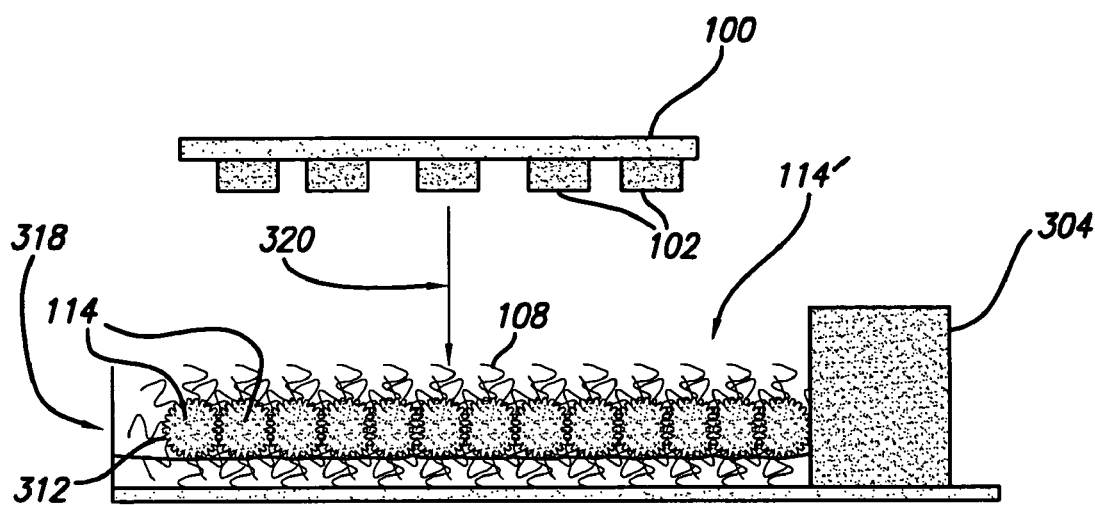
FIGS. 3a-3b are each a schematic view, depicting yet another embodiment for forming the buffer layer.

Reference is made now in detail to specific embodiments, which illustrates the best mode presently contemplated by the inventors for practicing the invention. Alternative embodiments are also briefly described as applicable.

Crossed electrode molecular devices are well known, and comprise a first electrode crossed by a second electrode at a non-zero angle. The crossed pair of electrodes forms a junction having a functional dimension ranging in size from a few microns to a few nanometers. A connector species comprising at least one switchable molecule is formed in the junction. Often, a molecular layer is employed.

In accordance with the teachings herein, a buffer layer is formed between the switchable molecule and the second electrode. The buffer layer serves to protect the switchable molecular layer during deposition of the second electrode thereon.

The buffer layer employs nanocrystals. The synthesis of nanocrystals is well known and produces particles with narrow size distributions ranging from 1 to 20 nanometers (nm) that are covered with a ligand capping layer (typically, but not necessarily, a thiol). At least four approaches can be used to make a buffer layer of such particles prior to deposition of the top (second) electrode.

The first two approaches involve self-assembly of molecules that have ligating groups on either end of the molecule (e.g., a dithiol), with one end capable of covalently bonding to the bottom (first) electrode and the other end capable of covalently bonding to the nanocrystal. The second two approaches involve close packing of an array of nanocrystals in a Langmuir trough before transfer onto the bottom electrode array with or without the organic monolayer.

Approach #1.

The bottom electrode assembly is first functionalized with a self-assembled monolayer by incubation in a solution containing the molecules whereby one of the ligating ends covalently attaches to the bottom electrode. The assembly is then removed from the solution and placed in a solution containing the nanocrystals. Over time, the nanocrystals lose some of their original capping ligands and covalently bond to the remaining free ligating end of the molecule attached to the bottom electrode.

FIGS. 1a-1c depict the process of this approach. A substrate 100 bearing an array of patterned electrically-conducting electrodes 102 is immersed in a first container 104 containing a solution 106 of molecules 108 with two ligating ends, as shown in FIG. 1a. One of the ligating ends of the molecules 108 covalently attaches to the bottom, or first, electrode 102.

The substrate 100 with bottom electrodes 102 and covalently bonded molecules 108 is moved to a second container 110 containing a solution 112 of nanocrystals 114 with ligand caps, as illustrated in FIG. 1b. As shown in partial section in FIG. 1b, the capped nanocrystals 114 comprise metal nanoparticles 114a with ligand caps 114b surrounding the nanoparticles.

The capped nanocrystals 114 covalently bond to the remaining free ligating end of the molecules 108 attached to the bottom electrodes 102, as shown in FIG. 1b.

The substrate 100 is removed, with bottom electrodes 102, molecules 108 covalently bonded thereto, and capped nanocrystals 114 covalently bonded to the molecules, as shown in FIG. 1c. At this point, the assembly 116 is ready for deposition of the top electrode.

Approach #2.

The nanocrystals themselves are first functionalized by incubation in a solution containing the molecule with two ligating ends. Ligand exchange occurs whereby the nanocrystal replaces many of its original capping ligands with the molecules in solution. The functionalized nanocrystals are then precipitated out of solution and re-dissolved in a suitable solvent into which the bare bottom electrode assembly is immersed, and incubated until covered with a self-assembled layer of nanocrystals.

FIGS. 2a-2c depict this approach. As shown in FIG. 2a, the capped nanocrystals 114 with ligand caps are functionalized in a tank 204 containing a solution 206 of the nanocrystals and molecules 108 with two ligating ends.

After the ligand exchange takes place, in which the molecule 108 attaches to a capped nanocrystal 114 by one of its ligating ends, the functionalized nanocrystals 114' are then precipitated out of solution and re-dissolved in a suitable solvent. FIG. 2b depicts a tank 210 containing a solution 212 comprising the functionalized capped nanocrystals 114' and the substrate 100 with electrodes 102 thereon. The functionalized capped nanocrystals 114' attach to the electrodes 102 by their remaining free ligating ends.

The substrate 100 is removed from the solution 212, with bottom electrodes 102, molecules 108 covalently bonded thereto, and capped nanocrystals 114 covalently bonded to the molecules, as shown in FIG. 2c. At this point, the assembly 216 is ready for deposition of the top electrode.

Approach #3.

Nanocrystals are functionalized as described in connection with approach #2. Specifically, the nanocrystals are first functionalized by incubation in a solution containing the molecule with two ligating ends. Ligand exchange occurs whereby the capped nanocrystal replaces many of its original capping ligands with the molecules in solution. After precipitation out of solution and re-dissolving in a suitable solvent, the functionalized capped nanocrystals are dispersed into a Langmuir-Blodgett trough and compressed until a close-packed monolayer is formed. Transfer to the substrate bearing a bottom array of bare electrodes is achieved by a so-called Schaefer dip, whereby the face of the substrate is horizontally lowered until it touches the close-packed monolayer. Transfer occurs upon raising the substrate.

Figure 3B:
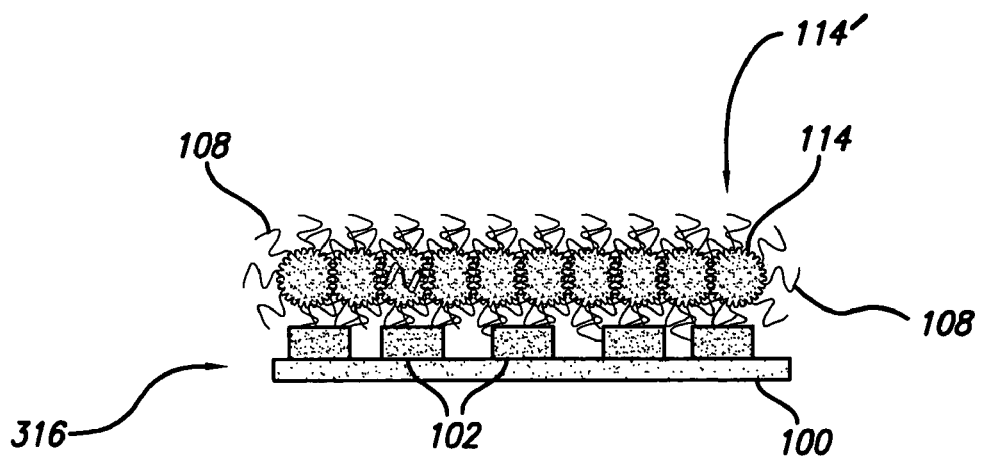

FIGS. 3a-3b depict this approach. The capped nanocrystals are functionalized as shown in FIG. 2a and are recovered, such as by precipitation out of solution and re-dissolving in a suitable solvent. As shown in FIG. 3a, the functionalized capped nanocrystals 114' are then dispersed into a Langmuir-Blodgett trough 304, which contains a solution 312 with the close-packed monolayer 318 of the functionalized capped nanocrystals thereon. Compression of the solution 312 to form the close-packed monolayer 318 is done by employing techniques well known in the Langmuir-Schaefer art.

The substrate 100 with the patterned metallic electrodes 102 supported thereon is dipped, face downward (Schaefer dip), into the close-packed monolayer 318 of the functionalized capped nanocrystals 114', as shown by the arrow 320 in FIG. 3a.

The substrate 100 is then removed from the Langmuir-Blodgett trough 304, with bottom electrodes 102, molecules 108 covalently bonded thereto, and capped nanocrystals 114 covalently bonded to the molecules, as shown in FIG. 3b. At this point, the assembly 316 is ready for deposition of the top electrode.

Approach #4.

The substrate bearing the bottom electrode is functionalized with a molecular monolayer that has been fabricated either through a self-assembly process or by a Langmuir-Blodgett deposition. Transfer of the buffer layer of non-functionalized molecules is done the same way as described in approach #3, using the Schaefer dip.

Figure 4A:
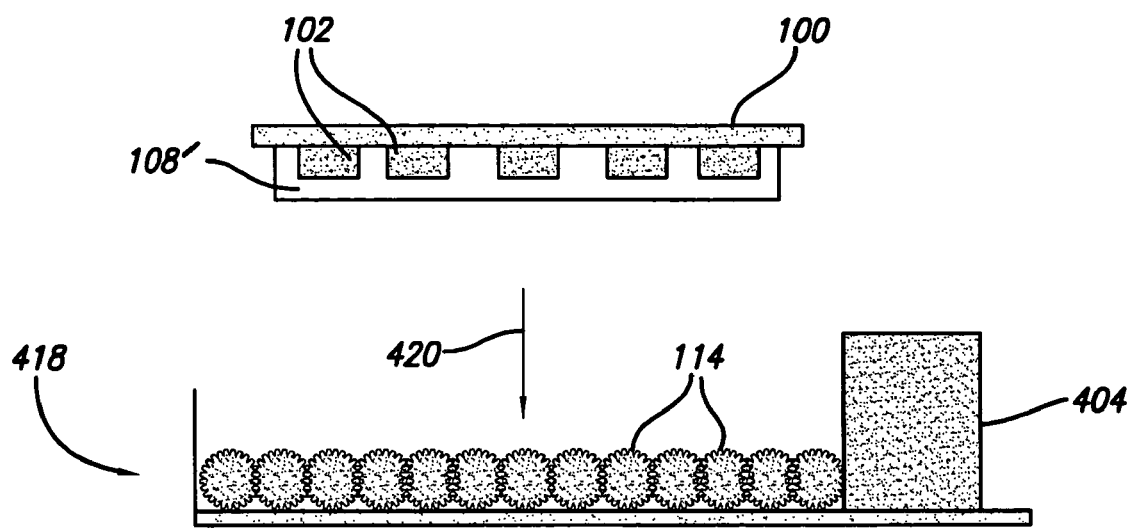
FIGS. 4a-4b are each a schematic view, depicting still another embodiment for forming the buffer layer.
Figure 4B:
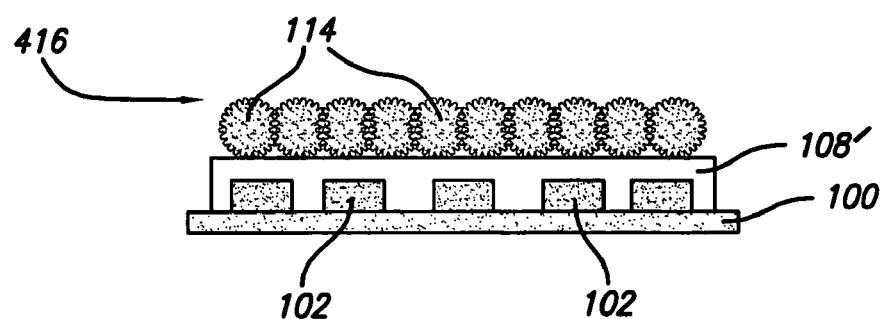

FIGS. 4a-4b depict this approach. FIG. 4a depicts a trough 404 containing a monolayer 418 of capped nanocrystals 114. A monolayer 108' of molecules 108 has been formed on the substrate 100 with patterned metallic electrodes 102. The formation of the monolayer 108' of molecules on the substrate 100 and covering the electrodes 102 may be performed by a number of processes, such as a self-assembly process or by a Langmuir-Blodgett deposition. Both such processes are well known in the art. The monolayer 108' may cover both the substrate 100 and patterned metallic electrodes 102, as shown in FIG. 4a, or may also be patterned and cover only the electrodes.

The substrate 100 with the patterned metallic electrodes 102 supported thereon and covered with the monolayer of molecules 108 is dipped into the monolayer 418 of the capped nanocrystals 114 (non-functionalized), as shown by the arrow 420 in FIG. 4a.

The substrate 100 is then removed from the Langmuir-Blodgett trough 404, with bottom electrodes 102, molecules 108 covalently bonded thereto, and capped nanocrystals 114 covalently bonded to the molecules, as shown in FIG. 4b. At this point, the assembly 416 is ready for deposition of the top electrode.

Additional Considerations.

In the practice of the various embodiments disclosed and claimed herein, the nanocrystals 114 may comprise any material that can be formed as a nanocrystal. Examples include, but are not limited to, gold, silver, and platinum. The nanocrystals are typically about 1 to 20 nm in diameter and are provided with attached ligands, which keep the nanocrystals from clumping together (a process often termed "ripening").

The length of the capping ligands on the nanocrystals 114 must not be too short; otherwise, the capping ligands no longer efficiently cap or passivate the nanocrystal, which could lead to (1) inhomogeneous size distribution of the nanocrystals, or (2) clumping or ripening of the nanocrystals. Capping ligands smaller than C4 may have these problems. On the other hand, if the length of the capping ligands is too long, their protective ability is defeated. Consistent with these considerations, short chain alkanes, specifically, C5 to C12 alkanes, are preferred in some embodiments.

There are two types of ligands employed in the practice of the various embodiments disclosed herein. One type of ligand is the capping ligand; this is the ligand 114b that initially surrounds the nanoparticle 114a, to form the capped nanocrystals 114. The second type of ligand is that associated with the molecule 108, which is provided with ligating ends. These may also be called functional ligands.

The exposed end of each functional ligand is provided with a coordinating moiety that coordinates with metal. An example of such a coordinating moiety is thiol (—SH), although the present invention is not so limited. Examples of other coordinating moieties include, but are not limited to, primary amines, nitriles, and hydroxyls.

The connector species, then, contains the switching moiety as well as coordinating moieties (functional ligands) on either end of the connector species. One of the functional ligands of the connector species attaches to the nanoparticle 114a itself. It will be appreciated that in solution, the capping ligands 114a are in equilibrium in solution, which means that capping ligands often detach from the nanoparticle and subsequently re-attach. During the period of detachment, the functional ligands may take their place. The other of the functional ligands of the connector species attaches to the first electrode 102.

The molecules, or connector species, 108 may include any of the switching molecules employed in molecular electronics. Examples include, but are not limited to, (1) rotaxanes, pseudo-rotaxanes, and catenanes, as disclosed, for example, in U.S. Pat. No. 6,459,095, issued on Oct. 1, 2002, and (2) molecules that evidence electric field induced band gap changes, as disclosed, for example, in application Ser. No. 09/823,195, filed Mar. 29, 2001, and published as Publication No. US-2002-0176276-A1 on Nov. 28, 2002. In the latter reference, the band gap changes occur via one of the following mechanisms: (1) molecular conformation change or an isomerization; (2) change of extended conjugation via chemical bonding change to change the band gap; or (3) molecular folding or stretching. Changing of extended conjugation via chemical bonding change to change the band gap may be accomplished in one of the following ways: (a) charge separation or recombination accompanied by increasing or decreasing band localization; or (b) change of extended conjugation via charge separation or recombination and $\pi$-bond breaking or formation. The contents of both references are incorporated herein by reference.

The ends of the molecules 108 may be provided with a coordinating moiety that coordinates with metals. A non-limiting example of such a coordinating moiety is —SH.

The length of the molecule 108 depends on the approach used. In approach #1, the length of the molecule 108 is not material, although it is important to note that the functional ligand can never be shorter in length than the capping ligand of the capped nanocrystal. If it is, it may be difficult to connect the nanocrystal to the electrode. In approaches #2 and #3, the length of the molecule cannot be too long. Specifically, the length of the molecule in these two approaches is preferably less than C20, including functional ligands and/or capping ligands. Approach #4 uses no functional ligands, but the capping ligands of the nanocrystal cannot be too long. If the capping ligands are too long, then the distance between metal cores of the capped nanocrystals increases, which in turn vitiates the ability of the nanocrystal layer to serve as an efficient protective layer. In general, the functional ligand may be at least 3 carbon atoms, and preferably 5 carbon atoms, longer than the capping ligand to effectively connect a nanoparticle to the substrate and to prevent crosslinking with each other (linking one nanocrystal to another).

Figure 5:
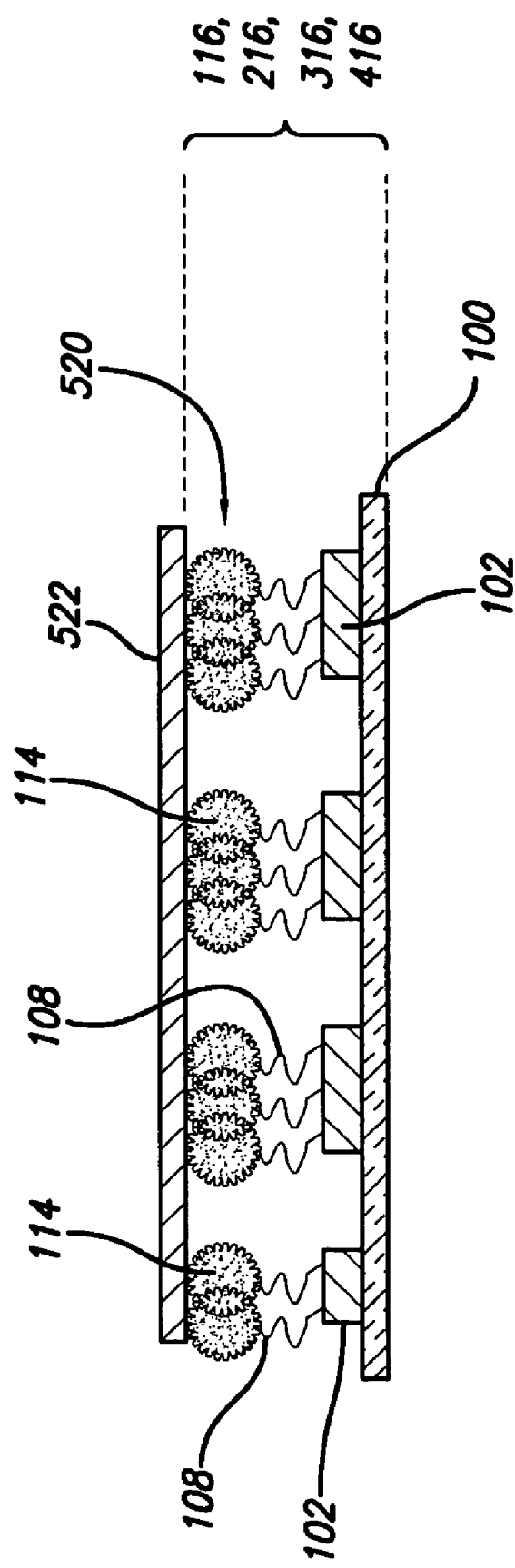
FIG. 5 is a cross-sectional view, depicting an embodiment of a crossed electrode molecular device, including the buffer layer.

Once the assembly 116, 216, 316, 416 is prepared, the top, or second, electrode may be deposited. FIG. 5 depicts the assembly 116, 216, 316, 416, comprising the substrate 100, the plurality of bottom electrodes 102, the switching molecules 108 attached to at least the bottom electrodes, and the buffer layer 520 comprising the nanocrystals 114 attached to the molecules. FIG. 5 further shows the structure after the top electrode 522 is deposited on the buffer layer 520.

In FIG. 5, the bottom electrodes 102 are shown perpendicular to the plane of the paper, while the top electrodes 522 are in the plane of the paper, thus providing a non-zero angle of 90 degrees. It will be appreciated that the non-zero angle may be other than 90 degrees, and is shown here as 90 degrees for convenience.

The deposition of the buffer layer 520 of metallic nanocrystals 114 onto the organic molecular layer 108 provides a mechanical barrier to the organic layer, shielding it from the effects of bombardment by the metal atoms making up the top electrode 522.

This approach improves the device yield using conventional depositional approaches, since fewer devices are shorted. Consequently, deposition processes that would have been deleterious without the presence of the buffer layer 520 may be practiced with little deleterious effect to the molecules 108.

Further, the interface between the organic layer 108 and the top electrode 522 is more uniform and less likely to experience chemical change during deposition of the top electrode.

Finally, if a self-assembly process is used to deposit the organic layer 108, this approach allows one to arbitrarily control the physical orientation of the molecules with respect to the top electrode 522 and bottom electrode 102.

INDUSTRIAL APPLICABILITY

The use of nanocrystals as a buffer layer is expected to find use in the fabrication of molecular devices.

What is claimed is:

1. A molecular device comprising a junction formed by a pair of crossed electrodes where a first electrode is crossed by a second electrode at a non-zero angle and at least one connector species comprises at least one switchable moiety and functional ligands at each end of said connector species, said at least one connector species electrically connecting said pair of crossed electrodes in said junction, said junction having a functional dimension in nanometers, said molecular device further including a buffer layer comprising nanocrystals with capping ligands thereon, the capping ligands being selected from alkanes having a chain length ranging from 5 carbons to 12 carbons, the buffer layer interposed between said connector species and said second electrode, whereby said connector species is attached to both said first electrode and said buffer layer and whereby said buffer layer is attached to said second electrode.

2. The molecular device of claim 1 wherein said switchable moiety is selected from the group consisting of rotaxanes, pseudo-rotaxanes, and catenanes.

3. The molecular device of claim 1 wherein said switchable moiety evidences an electric field induced band gap change.

4. The molecular device of claim 3 wherein said band gap change occurs via one of the following mechanisms: (1) molecular conformation change or an isomerization; (2)

change of extended conjugation via chemical bonding change to change the band gap; or (3) molecular folding or stretching.

5. The molecular device of claim 4 wherein changing of extended conjugation via chemical bonding change to change the band gap may be accomplished in one of the following ways: (a) charge separation or recombination accompanied by increasing or decreasing band localization; or (b) change of extended conjugation via charge separation or recombination and π-bond breaking or formation.

6. The molecular device of claim 1 wherein each said connector species has two opposed ends and is covalently bonded at one end to said first electrode and is covalently bonded at its other end to said nanocrystal, thereby forming a self-assembled monolayer of said connector species on said first electrode that are bonded to said buffer layer.

7. The molecular device of claim 1 wherein each said connector species has two opposed ends and said nanocrystals are functionalized with said connector species at one end thereof and wherein an other end of some of said connector species is covalently bonded to said first electrode to form a self-assembled layer of a functionalized buffer layer on said first electrodes.

8. The molecular device of claim 1 wherein each said connector species has two opposed ends and said nanocrystals are functionalized with said connector species at one end thereof and wherein said first electrode is coated with a monolayer of said functionalized nanocrystals.

9. The molecular device of claim 1 wherein said first electrode is supported on a substrate, wherein said substrate and said first electrode is functionalized with a monolayer of said connector species, and wherein said monolayer of connector species is coated with a monolayer of said nanocrystals.

10. The molecular device of claim 1 wherein said nanocrystals comprise a metal.

11. The molecular device of claim 10 wherein said nanocrystals comprise a metal selected from the group consisting of gold, silver, palladium, and platinum.

12. The molecular device of claim 1 wherein said nanocrystals are about 1 to 20 nm in diameter and wherein said capping ligands have two ends, one end of which is attached to said nanocrystal.

13. The molecular device of claim 12 wherein said connector species is longer than said capping ligands.

14. The molecular device of claim 1 wherein an exposed end of each said functional ligand is provided with a coordinating moiety.

15. The molecular device of claim 14 wherein said coordinating moiety is selected from the group consisting of thiols, primary amines, nitriles, and hydroxyls.

16. An array of molecular devices forming a crossbar, said molecular devices each comprising a junction formed by a pair of crossed electrodes where a first electrode is crossed by a second electrode at a non-zero angle and at least one connector species comprises at least one switchable moiety and functional ligands at each end of said connector species, said at least one connector species electrically connecting said pair of crossed electrodes in said junction, said junction having a functional dimension in nanometers, said molecular device further including a buffer layer interposed between said connector species and said second electrode, said buffer layer including nanocrystals with capping ligands thereon, the capping ligands being selected from alkanes having a chain length ranging from 5 carbons to 12 carbons, whereby said connector species is attached to both said first electrode and said buffer layer and whereby said buffer layer is attached to said second electrode.

17. The array of claim 16 wherein said switchable moiety is selected from the group consisting of rotaxanes, pseudo-rotaxanes, and catenanes.

18. The array of claim 16 wherein said switchable moiety evidences an electric field induced band gap change.

19. The array of claim 18 wherein said band gap change occurs via one of the following mechanisms: (1) molecular conformation change or an isomerization; (2) change of extended conjugation via chemical bonding change to change the band gap; or (3) molecular folding or stretching.

20. The array of claim 19 wherein changing of extended conjugation via chemical bonding change to change the band gap may be accomplished in one of the following ways: (a) charge separation or recombination accompanied by increasing or decreasing band localization; or (b) change of extended conjugation via charge separation or recombination and π-bond breaking or formation.

21. The array of claim 16 wherein each said connector species has two opposed ends and is covalently bonded at one end to said first electrode and is covalently bonded at its other end to said nanocrystal, thereby forming a self-assembled monolayer of said connector species on said first electrode that are bonded to said buffer layer.

22. The array of claim 16 wherein each said connector species has two opposed ends and said nanocrystals are functionalized with said connector species at one end thereof and wherein an other end of some of said connector species is covalently bonded to said first electrode to form a self-assembled layer of a functionalized buffer layer on said first electrodes.

23. The array of claim 16 wherein each said connector species has two opposed ends and said nanocrystals are functionalized with said connector species at one end thereof and wherein said first electrode is coated with a monolayer of said functionalized nanocrystals.

24. The array of claim 16 wherein said first electrode is supported on a substrate, wherein said substrate and said first electrode is functionalized with a monolayer of said connector species, and wherein said monolayer of connector species is coated with a monolayer of said nanocrystals.

25. The array of claim 16 wherein said nanocrystals comprise a metal.

26. The array of claim 25 wherein said nanocrystals comprise a metal selected from the group consisting of gold, silver, palladium, and platinum.

27. The array of claim 16 wherein said nanocrystals are about 1 to 20 nm in diameter and wherein said capping ligands have two ends, one end of which is attached to said nanocrystal.

28. The array of claim 27 wherein said connector species is longer than said capping ligand.

29. The array of claim 16 wherein an exposed end of each said functional ligand is provided with a coordinating moiety.

30. The array of claim 29 wherein said coordinating moiety is selected from the group consisting of thiols, primary amines, nitriles, and hydroxyls.

* * * * *